United States Patent
Sogo et al.

(10) Patent No.: US 9,559,006 B2
(45) Date of Patent: Jan. 31, 2017

(54) LIGHT EMITTING DEVICE AND METHOD OF MANUFACTURING LIGHT EMITTING DEVICE

(71) Applicant: Nichia Corporation, Anan-shi, Tokushima (JP)

(72) Inventors: Takayuki Sogo, Anan (JP); Takanobu Sogai, Anan (JP); Takeshi Kususe, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/821,369

(22) Filed: Aug. 7, 2015

(65) Prior Publication Data

US 2016/0043290 A1 Feb. 11, 2016

(30) Foreign Application Priority Data

Aug. 8, 2014 (JP) .................. 2014-163124

(51) Int. Cl.
| | |
|---|---|
| H01L 33/00 | (2010.01) |
| H01L 21/78 | (2006.01) |
| H01L 33/48 | (2010.01) |
| H01L 33/38 | (2010.01) |
| H01L 33/36 | (2010.01) |
| H01L 33/62 | (2010.01) |
| H01L 33/40 | (2010.01) |

(52) U.S. Cl.
CPC .............. *H01L 21/78* (2013.01); *H01L 33/36* (2013.01); *H01L 33/38* (2013.01); *H01L 33/382* (2013.01); *H01L 33/385* (2013.01); *H01L 33/48* (2013.01); *H01L 33/483* (2013.01); *H01L 33/486* (2013.01); *H01L 33/62* (2013.01); *H01L 33/405* (2013.01); *H01L 2933/005* (2013.01); *H01L 2933/0016* (2013.01)

(58) Field of Classification Search
None
See application file for complete search history.

(56) References Cited

U.S. PATENT DOCUMENTS

| | | | | |
|---|---|---|---|---|
| 8,614,455 | B2 * | 12/2013 | Obata | ............... H01L 33/62 257/88 |
| 8,823,031 | B2 * | 9/2014 | Kususe | ............ H01L 33/405 257/13 |
| 2011/0297994 | A1 | 12/2011 | Sugizaki et al. | |
| 2013/0285101 | A1 | 10/2013 | Sugizaki | |

(Continued)

FOREIGN PATENT DOCUMENTS

| | | |
|---|---|---|
| JP | 2006-114820 A | 4/2006 |
| JP | 2011-009572 A | 1/2011 |
| JP | 2011-249426 A | 12/2011 |

*Primary Examiner* — Minh-Loan Tran
(74) *Attorney, Agent, or Firm* — Foley & Lardner LLP

(57) ABSTRACT

A light emitting device includes a semiconductor light emitting element including a semiconductor stacked-layer body and an electrode disposed on a first surface of the semiconductor stacked-layer body; a resin member disposed on a first surface side of the semiconductor stacked-layer body; and a metal layer disposed in the resin member and electrically connected to the electrode. A recess is defined in an upper surface of the resin member. The metal layer is projected from the upper surface of the resin member, and is disposed to surround at least a portion of the recess.

20 Claims, 17 Drawing Sheets

(56) References Cited

U.S. PATENT DOCUMENTS

| | | | |
|---|---|---|---|
| 2014/0209955 A1* | 7/2014 | Kim | H01L 33/62 257/99 |
| 2015/0140702 A1* | 5/2015 | Ikeda | H01L 33/0079 438/27 |
| 2015/0263242 A1* | 9/2015 | Tomizawa | H01L 33/44 257/98 |

* cited by examiner

LIGHT EMITTING DEVICE AND METHOD OF MANUFACTURING LIGHT EMITTING DEVICE

CROSS-REFERENCE TO RELATED APPLICATION

The present application claims priority to Japanese Patent Application No. 2014-163124, filed on Aug. 8, 2014, which is incorporated by reference in its entirety.

BACKGROUND

1. Technical Field

The present disclosure relates to a light emitting device that includes a semiconductor light emitting element and a resin member provided with an internal wiring, and to a method of manufacturing the same.

2. Description of the Related Art

Light emitting devices using a semiconductor light emitting element such as a light emitting diode are widely used because of ease of miniaturization and high light emission efficiency. The light emitting elements used in light emitting devices can be roughly divided into two types, namely, a face up type in which a surface of a semiconductor light emitting element for disposing a pad electrode is on the opposite side from the mounting surface, and a face down type in which a surface of a light emitting element for disposing an electrode is a lower surface that faces a mounting substrate.

In the face up type, a semiconductor light emitting element is mounted on leads or the like, and the semiconductor light emitting element and the leads are connected via bonding wires or the like. Accordingly, in a plan view of a semiconductor light emitting element disposed on a mounting substrate—that is, seen from a perpendicular direction relative to the mounting surface of the mounting substrate—portions of the wires are needed to be outer side of the semiconductor light emitting element, which imposes a limitation in miniaturization of the light emitting element.

On the other hand, in the face down type (or flip chip type), a pad electrode disposed on a surface of a semiconductor light emitting element and a wiring disposed on a mounting substrate can be electrically connected via a connector such as a bump or a metal pillar, which are positioned within the outer peripheral line of the semiconductor light emitting element in a plan view seen from a direction perpendicular to the mounting surface of the mounting substrate. This configuration allows forming of a CSP (Chip Size Package or Chip Scale Package) in which the size of a light emitting device (particularly the size in a plan view seen from a direction perpendicular to the mounting surface of the mounting substrate) is reduced almost to the size of the chip of a semiconductor light emitting element.

In recent years, in order to achieve further miniaturization, or in order to further improve the light emission efficiency, a face down type light emitting device has been proposed, in which a growth substrate (a light-transmissive substrate) such as sapphire has been removed, or the thickness of the growth substrate has been reduced.

The growth substrate is a substrate for growing thereon an n-type semiconductor layer and a p-type semiconductor layer that are components of a semiconductor light emitting element. The growth substrate also exhibits the effect of improving the mechanical strength of the light emitting device by supporting a semiconductor light emitting element that is small in thickness and low in strength. Accordingly, in a light emitting device in which the growth substrate is removed or the thickness of the growth substrate is reduced after formation of a semiconductor light emitting element, for example as disclosed in JP 2011-249426 A, a resin layer is disposed on an electrode side (the side facing the mounting substrate) for supporting a bare chip (i.e., a semiconductor light emitting element), and internal wirings made of metal pillars or other wirings are formed so as to penetrate through the resin layer, and the electrode and an external terminal are electrically connected to each other. With such a resin layer that includes an internal wiring, sufficient mechanical strength can be reliably obtained.

In the case where such a light emitting device that has a resin layer disposed on the electrode side is mounted on a mounting substrate by using an electrically conductive adhesive member, for example using a solder and a reflowing method, melted solder may be squeezed out from between the electrode for external connection of the light emitting device and the wiring pattern of the mounting substrate. In particular, when the solder is excessively supplied, the solder squeezed out from between the electrode for external connection of the light emitting device and the wiring pattern of the mounting substrate may rise along a side surface of the resin layer. The solder that rises up the side surface of the resin layer may cause bonding defects between the light emitting device and the mounting substrate, or may contaminate the light extraction surface resulting in a reduction in the light extraction efficiency.

SUMMARY

Accordingly, an object of certain embodiments of the present invention is to provide a light emitting device with which the amount of adhesive (such as melted solder) that is squeezed out during mounting is reduced, and highly reliable mounting can be achieved, and a method of manufacturing the same.

A light emitting device according to an embodiment of the present invention includes a semiconductor light emitting element that includes a semiconductor stacked-layer body and an electrode disposed on one surface of the semiconductor stacked-layer body, a resin member disposed on the one surface side of the semiconductor stacked-layer body, and a metal layer disposed in the resin member and electrically connected to the electrode. A recess is defined in an upper surface of the resin member, and the metal layer is projected from the upper surface of the resin member, and is disposed to surround at least a portion of the recess.

A method of manufacturing a light emitting device according to an embodiment of the present invention is a method of manufacturing a light emitting device that includes a semiconductor light emitting element which includes a semiconductor stacked-layer body and an electrode disposed on one surface of the semiconductor stacked-layer body. The method includes a step of providing a wafer having a plurality of light emitting elements arranged in arrays, each light emitting element provided with the semiconductor stacked-layer body having an n-type semiconductor layer and a p-type semiconductor layer being stacked, a step difference formed by removing a portion of the semiconductor stacked-layer body from a predetermined region of an upper surface of the p-type semiconductor layer in a thickness direction to expose the n-type semiconductor layer, a step of forming a resin member comprising defining a recess by applying a liquid resin material to a one surface side of the semiconductor stacked-layer body to form a recess corresponding to a shape of the step difference in a surface of the applied resin material, and defining an opening in a portion of a surface region of the applied resin material above the electrode so that the opening at least partially surround the recess in a plan view, a step of forming a metal layer by filling the opening with a metal material so as to project further than an upper surface of the resin member, and singulating the wafer into a plurality of the semiconductor light emitting elements by cutting the wafer along boundary lines among the semiconductor light emitting elements.

With the light emitting device according to certain embodiments of the present invention, at the time of mounting, excessive adhesive can be held in the recess of the resin member and the space formed by the upper portion of the metal layer that is projecting from the resin member so as to at least partially surround the recess portion. Therefore, the amount of solder squeezed out from the arrangement region of the metal layer that is the mounting surface can be reduced. As a result, highly reliable mounting can be realized. Further, with the method of manufacturing a light emitting device according to certain embodiments of the present invention, the above-described light emitting device provided with the recess in the resin member and the space defined by the upper portion of the metal layer which surrounds at least a portion of the recess can be manufactured.

BRIEF DESCRIPTION OF THE DRAWINGS

FIGS. 1A and 1B are schematic diagrams showing a structure of a light emitting device according to an embodiment of the present invention, in which FIG. 1A is a perspective view and FIG. 1B is a plan view.

FIGS. 2A and 2B are schematic diagrams showing a structure of a light emitting device according to an embodiment of the present invention, in which FIG. 2A is a cross-sectional view taken along line II-II in FIG. 1B, and FIG. 2B is a cross-sectional view taken along line III-III in FIG. 1B.

FIGS. 3A and 3B are schematic diagrams showing a structure of a light emitting device according to an embodiment of the present invention, in which FIG. 3A is a cross-sectional view taken along line IV-IV in FIG. 1B, and FIG. 3B is a cross-sectional view taken along line V-V in FIG. 1B.

FIGS. 5A and 5B are schematic plan views showing a layer structure of a light emitting device according to an embodiment of the present invention, in which FIG. 5A shows an arrangement region of a p-type semiconductor layer and a cover electrode, and FIG. 5B shows an arrangement region of a light-reflecting electrode.

FIGS. 6A and 6B are schematic plan views showing a layer structure of a light emitting device according to an embodiment of the present invention, in which FIG. 6A shows an arrangement region of an insulating film, and FIG. 6B shows an arrangement region of an n-side electrode and a p-side electrode.

FIGS. 10A to 10E are schematic cross-sectional views showing a portion of steps of manufacturing a light emitting device according to an embodiment of the present invention, in which FIG. 10A illustrates forming a semiconductor stacked-layer body, FIG. 10B illustrates forming a light-reflecting electrode, FIG. 10C illustrates forming a cover electrode, FIG. 10D illustrates exposing a n-type semiconductor layer, and FIG. 10E illustrates forming an insulating film.

FIGS. 11A and 11B are schematic diagrams showing a step of forming a pad electrode in manufacturing of a light emitting device according to an embodiment of the present invention, in which FIG. 11A is a plan view, and FIG. 11B is a cross-sectional view taken along line I-I in FIG. 11A.

FIGS. 12A and 12B are schematic diagrams showing a step of forming a mask in manufacturing of a light emitting device according to an embodiment of the present invention, in which FIG. 12A is a plan view, and FIG. 12B is a cross-sectional view taken along line I-I in FIG. 12A.

FIGS. 13A and 13B are schematic cross-sectional views showing a step of forming a resin member in manufacturing of a light emitting device according to an embodiment of the present invention, in which FIG. 13A shows a sub-step of coating, and FIG. 13B shows a sub-step of exposing and developing.

FIGS. 14A and 14B are schematic cross-sectional views showing portion of steps of manufacturing a light emitting device according to an embodiment of the present invention, in which FIG. 14A shows a step of forming a metal layer, and FIG. 14B shows a step of removing a mask.

FIGS. 15A and 15B are schematic diagrams showing a step of separating a pad electrode in manufacturing of a light emitting device according to an embodiment of the present invention, in which FIG. 15A is a plan view, and FIG. 15B is a cross-sectional view taken along line I-I in FIG. 15A.

FIGS. 17A and 17B are schematic diagrams showing a structure of a light emitting device according to a variation of an embodiment of the present invention, in which FIG. 17A is a perspective view, and FIG. 17B is a cross-sectional view taken along line VI-VI in FIG. 17A.

DETAILED DESCRIPTION

Figure 1A:
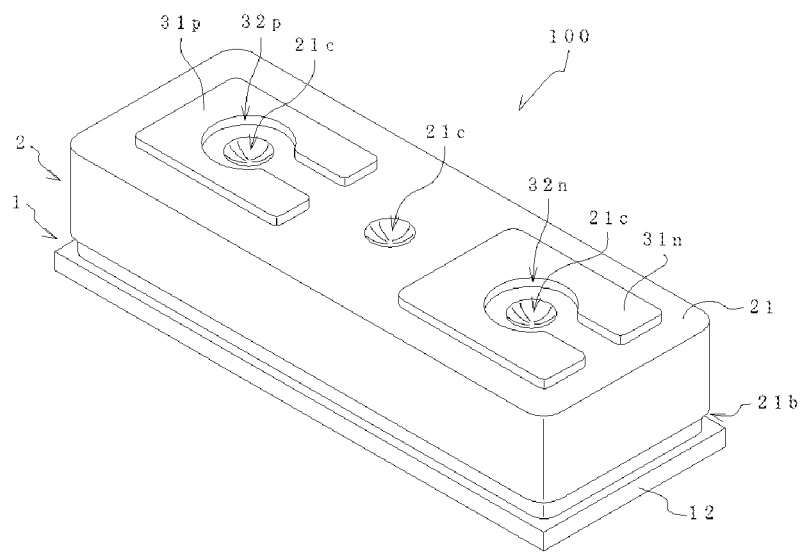

A light emitting device and a method of manufacturing the same according to embodiments of the present invention will be described below. Note that, because the drawings referred to in the following description schematically show the present invention, the scale, intervals, or positional relationship of the constituent elements may be exaggerated, or portions of the constituent elements may not be shown. Also, the sizes and/or intervals of the constituent elements may not be the same among corresponding perspective, plan view, and cross-sectional views. Also, in the following description, the same designations or the same reference numerals denote the same or similar members, and detailed descriptions thereof may be appropriately omitted.

Further, in connection with the light emitting device according to embodiments of the present invention, the terms such as "top/upper", "bottom/lower", "left", and "right", may be replaced by one another according to the situation. In the present specification, the terms such as "top/upper" and "bottom/lower" are used to illustrate a relative positional relationship between the components illustrated in the accompanying drawings and are not intended to specify absolute positions unless otherwise stated.

Structure of Light Emitting Device

Figure 4:
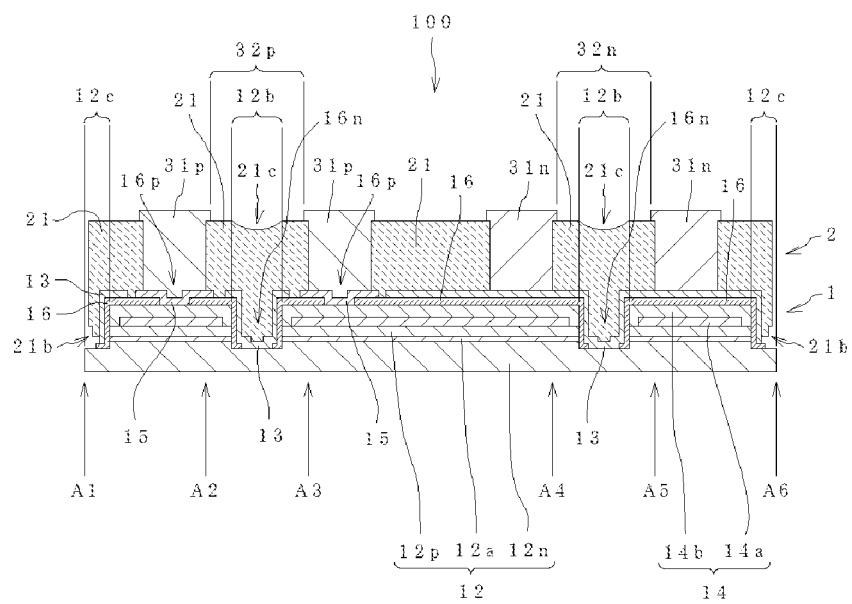
FIG. 4 is a schematic diagram showing a structure of a light emitting device according to an embodiment of the present invention, showing a cross-sectional view taken along line I-I in FIG. 1B.
Figure 5A:
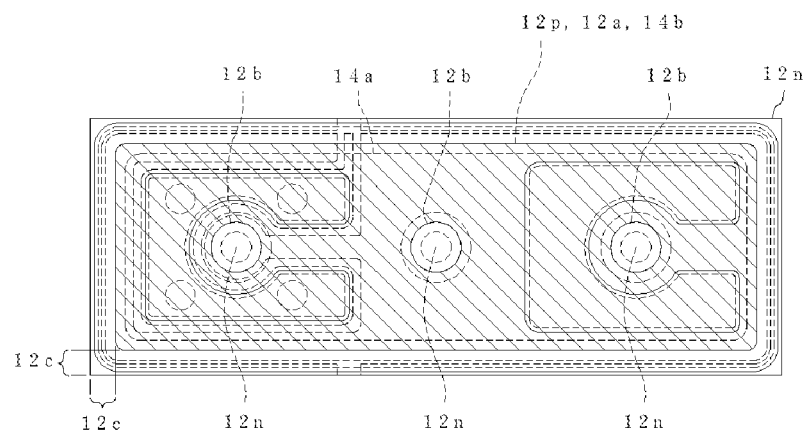
Figure 5B:
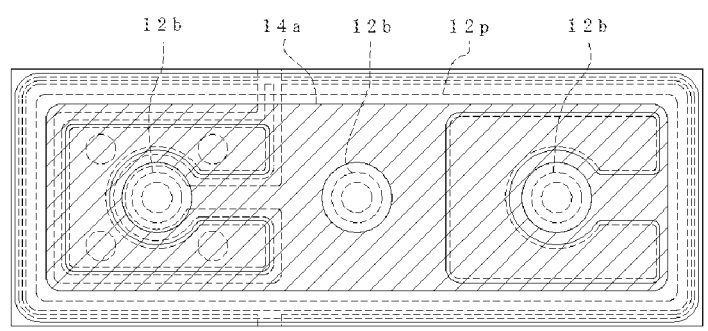

First, with reference to FIG. 1A to FIG. 7, a structure of a light emitting device according to an embodiment of the present invention will be described. Cross-sectional views of FIG. 2A to FIG. 3B respectively schematically show the cross sections taken along line II-II to line V-V in a plan view of FIG. 1B, while maintaining relative scale in the plan view. The cross-sectional view of FIG. 4 schematically shows the cross section taken along line I-I in the plan view of FIG. 1B. Positions A1 to A6 on line I-I in FIG. 1B correspond to positions A1 to A6 indicated by arrows in FIG. 2A to FIG. 4. The cross section taken along line III-III is the same cross section taken along a line connecting between position A1 and position A6. Thus, the cross-sectional view shown in FIG. 4 is formed by combining the cross sections of FIG. 2A to FIG. 3B as appropriate. Further, in order to show the substantial portion of the cross-sectional structure, the relative scale in the cross-sectional view of FIG. 4 is partially reduced from the relative scale (the widths of members) in the plan view of FIG. 1B. That is, the relative scale is not identical between FIG. 4 and FIG. 1B. Further, the cross-sectional views of FIG. 10A to FIG. 16 for illustrating the steps of manufacturing also respectively correspond to the cross section taken along line I-I in the plan view of FIG. 1B, as a same manner in FIG. 4, unless otherwise stated. Further, in FIG. 5A to FIG. 7, in order to illustrate the stacked layer structure of a light emitting device 100 according to the present embodiment, the arrangement region of each layer in a plan view is shown by hatching or shading.

As shown in FIG. 1A to FIG. 7, the outer shape of the light emitting device 100 according to the present embodiment is approximately rectangular parallelepiped-shaped. The light emitting device 100 is a CSP that includes a structure that includes a semiconductor light emitting element 1 with an LED (light emitting diode) structure from which a growth substrate has been removed (hereinafter referred to as the "light emitting element" as appropriate), and a support body 2 disposed on the one surface side of the light emitting element 1. Although the details will be illustrated below, the light emitting device 100 is a WCSP formed at a wafer level (a CSP obtained by wafer level processing).

On the one surface (the upper surface in FIG. 2A to FIG. 4) side of the light emitting element 1, an n-side electrode 13 and a p-side electrode 15 are disposed, and the support body 2 made of a resin member 21 is disposed. Further, in the resin member 21, as internal wirings, a metal layer (an n-side metal layer) 31$n$ and a metal layer (a p-side metal layer) 31$p$ are disposed. The metal layer 31$n$ is electrically connected to the n-side electrode 13, and the metal layer 31$p$ is electrically connected to the p-side electrode 15. The upper surface of each of the metal layers 31$n$ and 31$p$ exposed from the resin member 21 serves as the mounting surface for electrically connecting to the outside. The lower surface side of the light emitting element 1 serves as the light extraction surface. Further, the resin member 21 defines bowl-like recesses 21$c$ at three locations in the upper surface, and is provided with a step difference 21$b$ at a lower end side of the outer side surface, such that the lower outer edge is inward of the upper outer edge in a plan view. Also, the upper portion of each of the metal layers 31$n$ and 31$p$ are projected further than the upper surface of the resin member 21. Still further, the upper portion of each of the metal layers 31$n$ and 31$p$ is disposed to surround, in an approximately C-shaped manner in a plan view, one of the recess portions 21$c$ formed at the upper surface of the resin member 21. Accordingly, recesses 32$n$ and 32$p$ are respectively defined in a center of the upper portions of the approximately C-shaped metal layers 31$n$ and 31$p$.

Although a growth substrate 11 (see FIG. 10A) used in forming a semiconductor stacked-layer body 12 has been removed from the light emitting element 1, the light emitting element 1 may include the growth substrate 11 as it is or having its thickness reduced by polishing. Further, on the back surface side of the semiconductor stacked-layer body 12 from which the growth substrate 11 has been removed, or on the back surface side of the growth substrate 11, a phosphor layer which contains a phosphor may be disposed.

Next, each member of the light emitting device 100 will be described in detail below. The light emitting element 1 has a rectangular plate-like shape in a plan view, and is a face down type LED chip, i.e., the n-side electrode 13 and the p-side electrode 15 are disposed on the one surface side of the light emitting element 1.

The light emitting element 1 includes the semiconductor stacked-layer body 12 in which an n-type semiconductor layer 12$n$ and a p-type semiconductor layer 12$p$ are stacked. The semiconductor stacked-layer body 12 emits light upon supplying electric current between the n-side electrode 13 and the p-side electrode 15. Preferably, an active layer 12$a$ is disposed between the n-type semiconductor layer 12$n$ and the p-type semiconductor layer 12$p$.

As shown in FIGS. 1B, 2A, 3A and 3B, in the semiconductor stacked-layer body 12, regions where the p-type semiconductor layer 12$p$ and the active layer 12$a$ partially do not exist, that is, regions being recessed in the surface of the p-type semiconductor layer 12$p$, are formed (such regions are referred to as "step difference 12$b$"). The light emitting element 1 is provided with a circular step difference 12$b$ at three locations in a plan view. The bottom surface of each step difference 12$b$ is defined in the n-type semiconductor layer 12$n$, and through the opening 16$n$ of the insulating film 15 at a portion of the bottom surface of the step difference 12$b$, the n-type semiconductor layer 12$n$ and the n-side electrode 13 are electrically connected.

Further, along the outer periphery of the semiconductor stacked-layer body 12, a step difference 12$c$ is defined in which the p-type semiconductor layer 12$p$ and the active layer 12$a$ are not present. The step difference 12$c$ is formed at the boundary region (dicing street) which is a region along a boundary line 40 (see FIG. 10D) of the light emitting element 1 in the wafer state.

Further, the side surface being the outer edge of the semiconductor stacked-layer body 12 in a plan view, that is, the side surface being the outer edge of the n-type semiconductor layer 12$n$, is covered by none of the insulating film 16 and the resin member 21. In the step of singulating (S113) (see FIG. 9) which is the final step in the process of manufacturing the light emitting device 100 in the wafer level processing, the semiconductor stacked-layer body 12 is divided, and the surface formed by such division becomes the side surface being the outer edge in a plan view. Accordingly, in the singulated light emitting device 100, the side surface being the outer edge of the semiconductor stacked-layer body 12 is exposed.

Further, as shown in FIG. 1A to FIG. 5B, on substantially the entire surface of the upper surface of the p-type semiconductor layer 12p of the semiconductor stacked-layer body 12, a full-surface electrode 14 in which a light-reflecting electrode 14a and a cover electrode 14b are stacked is disposed. That is, in FIG. 5A, a region hatched by diagonal lines is the region where the p-type semiconductor layer 12p and the cover electrode 14b are disposed. Further, the light-reflecting electrode 14a has its upper and side surfaces covered by the cover electrode 14b, and as shown by hatched in FIG. 5B in a plan view, disposed on an inner region that is included in the region where the cover electrode 14b is disposed.

Figure 6A:
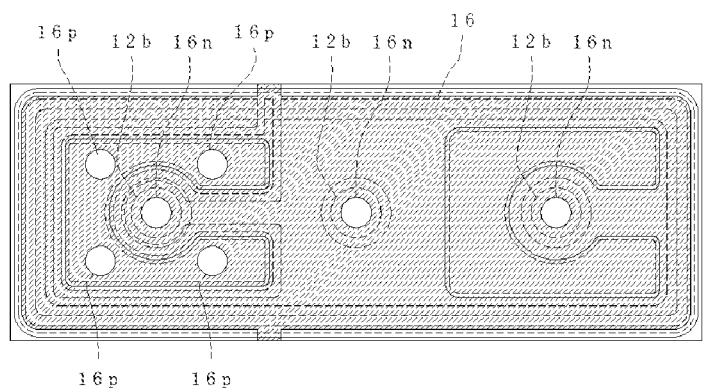
Figure 6B:
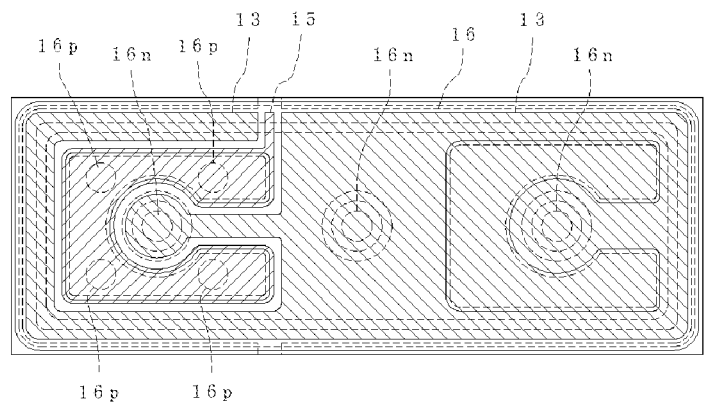
Figure 7:
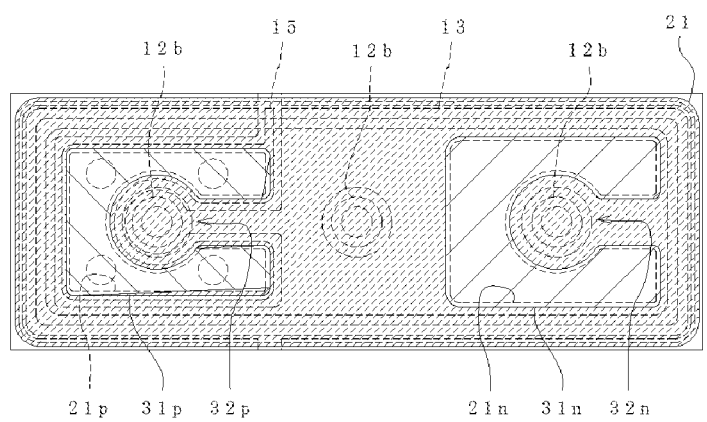
FIG. 7 is a schematic plan view showing a layer structure of a light emitting device according to an embodiment of the present invention, showing an arrangement region of a resin member and a metal layer.

Further, as shown in FIG. 1A to FIG. 4 and FIG. 6A, the insulating film 16 is disposed at the upper and side surfaces of the full-surface electrode 14 and the upper and side surfaces of the semiconductor stacked-layer body 12 (the region shaded by dots in FIG. 6A). The insulating film 16 has openings 16n at the bottom surface of the step differences 12b, and openings 16p over a portion of the cover electrode 14b. The openings 16n are defined in a circular shape in each of the bottom surfaces of the step differences 12b formed at three portions. Further, the openings 16p are circularly formed at four locations over the cover electrode 14b. Still further, although the insulating film 16 also has an opening at the bottom surface of the step difference 12c, the insulating film 16 may cover the entire upper surface of the n-type semiconductor layer 12n to the end portion without having the opening.

Further, as shown in FIG. 1A to FIG. 4 and FIG. 6B, the p-side electrode 15 being the p-side pad electrode of the light emitting element 1 is electrically connected to the cover electrode 14b at the openings 16p. The p-side electrode 15 is formed at the upper surface of the cover electrode 14b on the left region in FIG. 6B via the insulating film 16. Further, the p-side electrode 15 is formed to further extend to portion of the side and bottom surfaces of the step difference 12c (near the center of the upper side in FIG. 6A), via the insulating film 16. Still further, the n-side electrode 13 being the n-side pad electrode of the light emitting element 1 is electrically connected to the n-type semiconductor layer 12n at the openings 16n. The n-side electrode 13 is formed to extend to the bottom and side surfaces of the step differences 12b, to the upper and side surfaces of the cover electrode 14b except for the region where the p-side electrode 15 is disposed and the nearby region, and to the side and bottom surfaces of the step difference 12c, via the insulating film 16, respectively. That is, in the light emitting element 1, both the n-side electrode 13 and the p-side electrode 15 are disposed on the one surface side of the semiconductor stacked-layer body 12. Further, in this manner, since the n-side electrode 13 and/or the p-side electrode 15 are widely provided at the upper and side surfaces of the light emitting element 1, heat can be effectively transferred to the resin member 21 of the support body 2, which will be described later. Thus, the heat releasing property of the light emitting device 100 can be improved.

For the semiconductor stacked-layer body 12 (the n-type semiconductor layer 12n, the active layer 12a, and the p-type semiconductor layer 12p), $In_XAl_YGa_{1-X-Y}N$ ($0 \leq X$, $0 \leq Y$, $X+Y<1$) or the like is suitably used. The semiconductor layers may each have a single-layer structure, or have a stacked-layer structure or a superlattice structure made of layers having different compositions and thicknesses. In particular, the active layer 12a preferably has a single quantum well structure or a multiple quantum well structure which is made of stacked layers of thin layers; each can produce quantum effect.

The full-surface electrode 14 is to serve as a current diffusion layer and a reflective layer, and has a stacked-layer configuration that includes the light-reflecting electrode 14a and the cover electrode 14b being stacked. The light-reflecting electrode 14a is disposed so as to cover substantially the entire upper surface of the p-type semiconductor layer 12p. Further, the cover electrode 14b is disposed so as to entirely cover the upper and side surfaces of the light-reflecting electrode 14a. The light-reflecting electrode 14a is an electrically conductive layer provided so that the current supplied via the cover electrode 14b and the p-side electrode 15 disposed on a portion of the upper surface of the cover electrode 14b can be diffused evenly over the entire p-type semiconductor layer 12p. The light-reflecting electrode 14a has good light reflectivity, and functions also as a light-reflecting layer so that the light emitted by the light emitting element 1 is reflected in a lower direction, i.e., toward the light extraction surface.

The light-reflecting electrode 14a may be made of a metal material having good electrical conductivity and light reflectivity. In particular, as a metal material to exhibit good light reflectivity in the visible light region, Ag, Al or an alloy whose main component is one or more of those metals can be suitably used. Further, the light-reflecting electrode 14a may be made of a single layer of such metal materials, or may have a stacked-layer of such metal materials.

Further, the cover electrode 14b is a barrier layer to prevent migration of the metal material used for the light-reflecting electrode 14a. In the case where Ag or an alloy whose main component is Ag that tends to experience migration is used as the light-reflecting electrode 14a, it is preferable to provide the cover electrode 14b. The cover electrode 14b may be made of a metal material having good electrical conductivity and barrier property, and for example, Al, Ti, W, Au, or an AlCu alloy may be used. The cover electrode 14b may be made of a single layer of such metal materials, or may have a stacked-layer of such metal materials.

The n-side electrode 13 is electrically connected to the n-type semiconductor layer 12n through the three openings 16n defined in the insulating film 16 at the bottom surface of the step differences 12b. In this manner, with connecting the n-side electrode 13 to the n-type semiconductor layer 12n at portions provided in a wide area, the current supplied via the n-side electrode 13 can be evenly diffused to the n-type semiconductor layer 12n. Accordingly, the light emission efficiency can be improved. In a plan view shown in FIG. 1B, for the sake of convenience, the arrangement region of the cover electrode 14b is shown in conformity to the arrangement region of the p-type semiconductor layer 12p, but the cover electrode 14b is disposed slightly inward of the p-type semiconductor layer 12p. This is similar in the drawings for the steps of manufacturing to be illustrated below. The p-side electrode 15 is electrically connected to the cover electrode 14b at the four openings 16p defined in the insulating film 16 which is disposed on the upper surface of the cover electrode 14b. As shown in FIG. 6A, the metal layer 31n having an approximately C-shape in a plan view is disposed on the upper surface of the n-side electrode 13 so as to be electrically connected to the n-side electrode 13. The metal layer 31p having an approximately C-shape in a plan view is disposed on the upper surface of the p-side electrode 15 so as to be electrically connected to the p-side electrode 15.

The n-side electrode 13 and the p-side electrode 15 may be made of a metal material. For example, a single metal such as Ag, Al, Ni, Rh, Au, Cu, Ti, Pt, Pd, Mo, Cr, or W or an alloy whose main component is one or more of those metals can be suitably used. In the case of using an alloy, for example, an AlSiCu alloy (ASC) which contains a non-metal element such as Si as its composition element may also be employed. Further, the n-side electrode 13 and the p-side electrode 15 may be made of a single layer of such metal materials, or may have a stacked-layer of such metal materials. The stacked-layer structure may be, for example, Ti/ASC/Ni or Ti/ASC/Pd, in order from the semiconductor stacked-layer body 12 side.

The insulating film 16 is a coating film having an insulating property and coating the upper and side surfaces of the semiconductor stacked-layer body 12 and the upper and side surfaces of the full-surface electrode 14. The insulating film 16 functions as the protective film and the antistatic film of the light emitting element 1. Further, the n-side electrode 13 and the p-side electrode 15 are complementarily formed over the wide area of the upper surface of the insulating film 16. The insulating film 16 may be made of a metal oxide or a metal nitride. For example, at least one type of oxide or nitride selected from the group consisting of Si, Ti, Zr, Nb, Ta, and Al can be suitably used. Further, the insulating film 16 may be made of at least two types of light-transmissive dielectrics differing in index of refraction being stacked to form a DBR (Distributed Bragg Reflector) film.

The light emitting element 1 shown in FIG. 1A to FIG. 4 is an example, and the present invention is not limited thereto. The light emitting element 1 has the n-side electrode 13 and the p-side electrode 15 disposed on a first surface side of the semiconductor stacked-layer body 12; the arrangement region of the step differences 12b, the n-side electrode 13 and the p-side electrode 15 can be determined as appropriate. Further, the n-type semiconductor layer 12n and the n-side electrode 13 may be electrically connected to each other at the step difference 12c, in place of or in addition to the step differences 12b.

The support body 2 has a rectangular shape in a plan view which is a substantially same shape as the outer shape of the light emitting element 1, and is disposed so as to be bonded to the surface of the light emitting element 1 where the n-side electrode 13 and the p-side electrode 15 are arranged. The support body 2 is a reinforcing member for mechanically supporting the structure of the light emitting element 1 from which the growth substrate 11 (see FIG. 10A) has been removed. The support body 2 is structured by the resin member 21 which includes the metal layers 31n and 31p. In a plan view, the light emitting device 100 shown in FIG. 1A to FIG. 4 has the support body 2 enclosed in the light emitting element 1, but the support body 2 and the light emitting element 1 may be overlapping with each other, or the support body 2 may enclose the light emitting element 1.

The resin member 21 is a base material serving as the reinforcing member of the light emitting element 1. In a plan view shown in FIG. 1A to FIG. 4 and FIG. 7, the resin member 21 has a substantially similar shape to the outer shape of the light emitting element 1 (the region shaded by dots in FIG. 7), and the resin member 21 is provided with the step difference 21b at its side surface such that the lower portion is enclosed in the upper portion. Further, the resin member 21 defines three bowl-shaped recesses 21c in its upper surface, which are the regions above the step differences 12b of the semiconductor stacked-layer body 12. In the present specification, the term "above" used in a positional relationship indicates a higher position within the outer periphery of a particular portion. The recesses 21c are defined corresponding to the shape of the step differences 12b, at the time of forming the resin member 21 on the upper surface of the light emitting element 1. Further, the resin member 21 defines openings 21n and 21p each made in an approximately C-shape in a plan view, and, the metal layers 31n and 31p of internal wirings are disposed penetrating in the thickness direction in the openings 21n and 21p. The metal layers 31n and 31p are disposed to surround at least a portion of different recesses 21c respectively, that is, in a plan view, the metal layers 31n and 31p are each disposed in an approximately C-shape around respective recesses 21c. The metal layers 31n and 31p are disposed so that the upper portions of the metal layers 31n, 31p projected from the upper surface of the resin member 21, that is, the regions shown by hatched with diagonal lines in FIG. 7 in a plan view, are extended on portions of the upper surface of the resin member 21 that surround the opening edge of the openings 21n and 21p, that is the region represented by broken lines in the region shown by hatched with diagonal lines in FIG. 7.

The shape of the recesses 21c is not particularly limited, and the shape in a plan view may be rectangular or polygonal. The width (the diameter in the case of a circular shape) of the recesses 21c in a plan view or the depth at the center portion thereof is not particularly limited, but the width is preferably about 20 μm to about 60 μm, and the depth at the center portion thereof is preferably about 3 μm to about 5 μm. Defining the recesses 21c with such a size allows excessive solder to be effectively held in the recesses 21c at the time of mounting.

Further, the recesses 21c are respectively defined in the regions above the step differences 12b of the semiconductor stacked-layer body 12, so that the load acting on the light emitting device 100 at the time of mounting the light emitting device 100 can be prevented from directly acting on the step differences 12b. That is, the load acting on the insulating film 16 and n-side electrode 13 that covers the side surfaces of the step differences 12b at the time of mounting can also be reduced. Accordingly, damage to the insulating film 16 and the n-side electrode 13 which may cause, for example, occurrence of leakage current can be suppressed. As a result, the reliability of the light emitting device 100 can be improved.

The resin material of the resin member 21 may be any material known in the art. Preferably, a photosensitive material used as photoresist is used. Through the use of a photosensitive resin material, the resin member 21 can be patterned by using photolithography method.

Further, in order to enhance thermal conductivity, the resin member 21 may contain a thermally conductive member, e.g., granular carbon black or aluminum nitride (AlN). In order to efficiently extract the light from the light emitting element 1 from the lower surface side (the light extraction surface side), the resin member 21 may contain a light-reflecting filler, e.g., $TiO_2$, $SiO_2$, or $Al_2O_3$. In the case where the resin member 21 contains a light-reflecting filler, the full-surface electrode 14 of the light emitting element 1 may be formed using a light-transmissive electrically conductive material such as indium tin oxide (ITO) or indium zinc oxide (IZO).

The lower limit of the thickness of the resin member 21 can be determined so that the resin member 21 has a sufficient mechanical strength as the reinforcing member of the light emitting element 1 in the case where the growth substrate 11 (see FIG. 10A) has been removed or the thickness thereof has been reduced. For example, in view of the reinforcing member, the thickness of the resin member 21 is preferably about 30 µm or more, and more preferably about 90 µm or more. The upper limit of the thickness of the resin member 21 can be determined considering the proportion of the volume of metal in the resin member 21 and the amount of heat generated from the light emitting element 1 to obtain sufficient heat dissipation. For example, about 150 µm or less is preferable and about 120 µm or less is more preferable.

The metal layer (the n-side metal layer) 31n is disposed penetrating the resin member 21 in the thickness direction. The lower surface of the metal layer 31n is connected to the n-side electrode 13 of the light emitting element 1, and the upper surface of the metal layer 31n serves as the mounting surface for external connection. That is, the metal layer 31n is an n-side internal wiring, and also serves as an n-side external connection electrode. Further, the upper portion of the metal layer 31n is projected from the upper surface of the resin member 21, and in a plan view, formed into an approximately C-shape so as to surround one of the recesses 21c defined in the upper surface of the resin member 21. That is, as seen from the upper surface side of the metal layer 31n, the recess 21c which is the recess 32n which is defined by the upper surface of the resin member 21 as a bottom surface and the upper portion of the metal layer 31n protruding from the resin member 21 as a side wall which at least partially surround the recess 32n, and the recess 21c defined in the upper surface of the resin member 21 is located in the recess 32n.

The metal layer (the p-side metal layer) 31p is disposed penetrating the resin member 21 in the thickness direction. The lower surface of the metal layer 31p is connected to the p-side electrode 15 of the light emitting element 1, and the upper surface of the metal layer 31p serves as the mounting surface for external connection. That is, the metal layer 31p is a p-side internal wiring, and also serves as a p-side external connection electrode. Further, the upper portion of the metal layer 31p is projected from the upper surface of the resin member 21, and in a plan view, formed into an approximately C-shape so as to surround one of the recesses 21c defined in the upper surface of the resin member 21. That is, as seen from the upper surface of the metal layer 31p, the recess 32p which is defined by the upper surface of the resin member 21 as a bottom surface and the upper portion of the metal layer 31p projecting from the resin member 21 as a side wall which at least partially surround the recess 32p, and the recess 21c defined in the upper surface of the resin member 21 is located in the recess 32p.

Further, the upper portions of the metal layers 31n and 31p projecting from the resin member 21 are respectively arranged in an approximately C-shape or an approximately U-shape in a plan view so as to surround the recess 21c with an opening. Thus, with the use of the load perpendicularly acting on the light emitting device 100 at the time of mounting the light emitting device 100, an excessive bonding member can be released in the opening direction. Accordingly, the range of appropriate amount of the bonding member supplied in a step of mounting, i.e., the allowable range, can be extended to greater supply amount. Further, the shape of the recesses 32n and 32p in a plan view is not limited to a shape with a single opening such as an approximately C-shape or an approximately U-shape and a shape with two or more openings can also be employed.

The difference in height between the upper surfaces of the metal layers 31n and 31p and the upper surface of the resin member defining the opening edge of the recess 21c of the resin member 21, that is, the depth of the recesses 32n and 32p of the metal layers 31n and 31p as seen from the upper surface of the metal layers 31n and 31p is preferably about 5 µm to about 50 µm, and more preferably about 10 µm to about 45 µm. Thus, during the mounting process, excessive solder can be effectively kept in the recess portions 32n and 32p.

Further, in the present embodiment, the upper surfaces of the metal layers 31n and 31p are respectively formed to be flat, but is not limited thereto, the upper surfaces may be formed with recesses and projections. In the case where the upper surfaces of the metal layers 31n and 31p are formed with recesses and projections, the height from the upper surface of the resin member 21 to the top of the projections is preferably within the range described above.

Figure 1B:
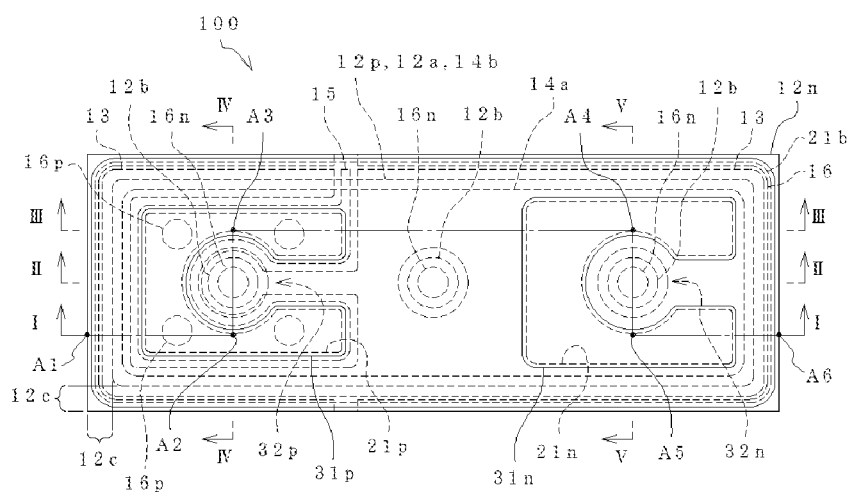
Figure 2A:
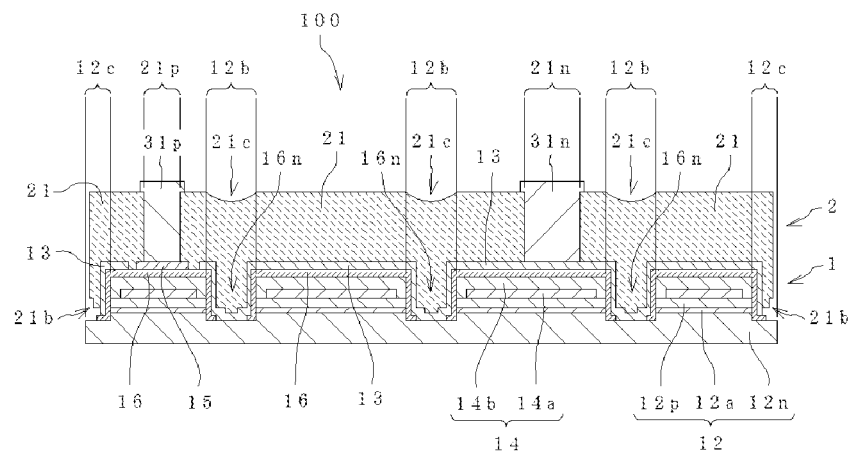
Figure 2B:
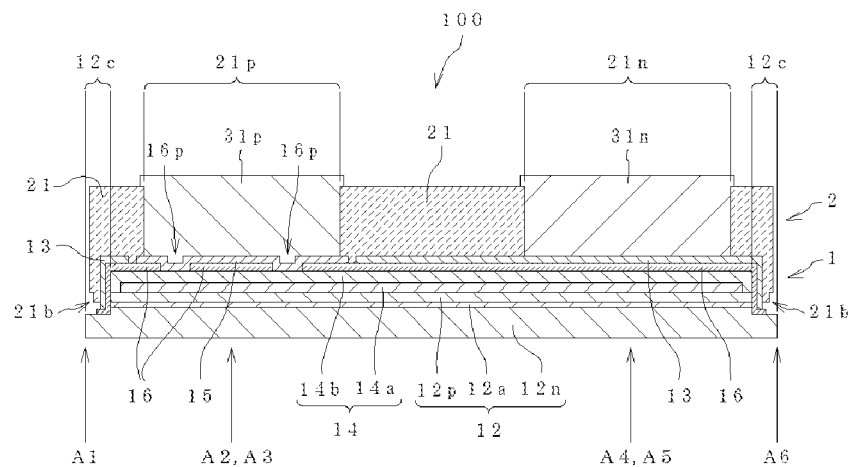
Figure 3A:
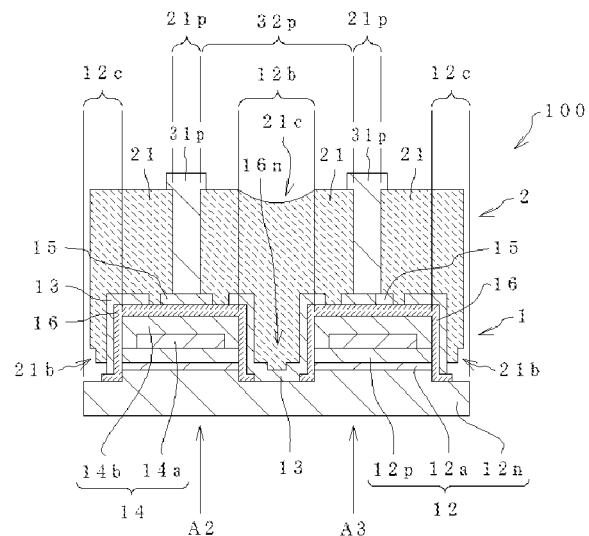
Figure 3B:
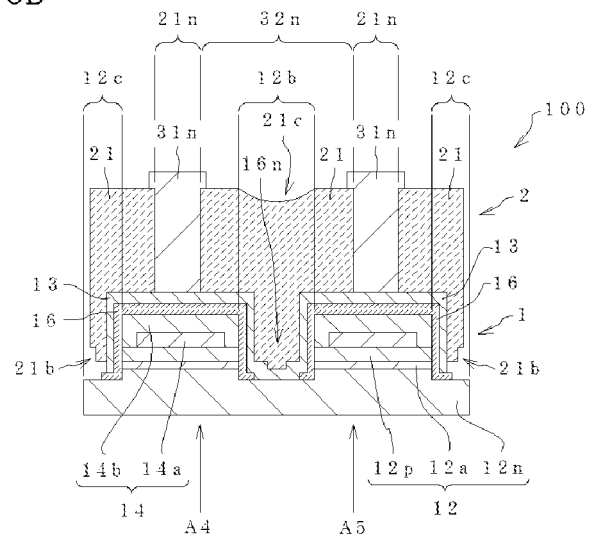

Further, in the example shown in FIG. 1B, the metal layers 31n and 31p are respectively formed in an approximately C-shape with an opening (the right side in FIG. 1B) in a plan view to surround the recess 21c of the resin member 21, but it is not limited thereto. The metal layers 31n and 31p may have, in a plan view, a shape with two or more openings that surrounds the recess 21c. Alternatively, the upper portions of the metal layers 31n and 31p may be formed to surround the recess portion 21c without the opening.

Further, the metal layers 31n and 31p also function as the heat transferring paths for releasing the heat generated by the light emitting element 1. Accordingly, the proportion of the volume of metal with respect to the resin member 21 is preferably greater.

The metal layers 31n and 31p may be suitably made of a metal such as Cu, Au, Al or the like. The metal layers 31n and 31p may also have a stacked-layer structure using a plurality of types of metal. Particularly, the uppermost surfaces of the metal layers 31n, 31p that serve as the mounting surface are preferably made of Au so as to prevent corrosion and to enhance the bonding with the mounting substrate, via an Au alloy-based adhesive member such as an Au—Sn eutectic solder. Further, in the case where the lower layer portions of the metal layers 31n and 31p are made of a metal other than Au, e.g., Cu or Al, the upper layer portion may have a stacked-layer structure such as Ni/Au or Ni/Pd/Au, in order to improve adhesion to Au. Further, a solder such as Sn—Cu or Sn—Ag—Cu can be employed as the adhesive member. In this case, the uppermost layers of the metal layers 31n and 31p are preferably made of a material which allows for good adhesion to the adhesive material that is used. The metal layers 31n and 31p can be formed by using an electroplating method. The method of forming the metal layers 31n and 31p will be described in detail below.

Mounting of Light Emitting Device

Figure 8:
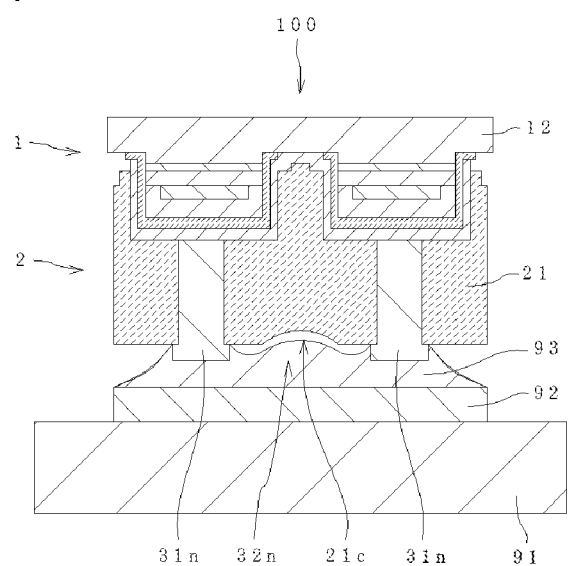
FIG. 8 is a schematic diagram for illustrating mounting of a light emitting device according to an embodiment of the present invention on a mounting substrate, showing a cross-sectional view taken along line V-V in FIG. 1B.

Next, with reference to FIG. 8, a description will be given of preventing a solder from being squeezed out when the light emitting device 100 is mounted on the mounting substrate. FIG. 8 shows a cross section of the light emitting device 100 taken along line V-V in FIG. 1B, that is, FIG. 8 shows a cross section of the n-side mounting surface shown in FIG. 3B. The configuration of the p-side mounting surface (a cross section taken along line IV-IV in FIG. 1B) of the light emitting device 100 is similar to that of the n-side mounting surface, so that the description thereof will be appropriately omitted.

As shown in FIG. 8, the light emitting device 100 is mounted in a face down manner, so that the mounting surface of a mounting substrate 91 provided with a wiring pattern 92 and the surface provided with the support body 2; that is, the surfaces of the metal layers 31n and 31p exposed outside the resin member 21, are facing each other. Thus, the light emitting device 100 in FIG. 8 is upside-down as compared to FIG. 3B. The light emitting device 100 is mounted on the mounting substrate 91 by using a reflow method, using an adhesive member 93 such as an Au—Sn eutectic solder.

In the step of mounting, the adhesive member 93 that has already been applied between the metal layer 31n and the wiring pattern 92 is melted, and then allowed to cool. Thus, the metal layer 31n and the wiring pattern 92 are strongly bonded to each other.

In this step, when the adhesive member 93 is melted and is in a liquid state, an excessive adhesive member 93 may be squeezed out from between the metal layer 31n and the wiring pattern 92. A large portion of the squeezed out excessive adhesive member 93 can be held in the recess 32n of the metal layer 31n that serves as the external connection electrode, and further held in the recess 21c of the resin member 21, thus allowing a reduction in the amount of the adhesive member 93 squeezed out beyond the outer edge of the region where the metal layer 31n is arranged in a plan view. Accordingly, the adhesive member 93 can be prevented from rising along the side surface of the resin member 21. As a result, the light emitting device 100 can be mounted on the mounting substrate 91 with high reliability.

Further, the step difference 21b formed at the side surfaces of the resin member 21 increases the distance along the surfaces from the lower end of the resin member 21 (upper end in FIG. 3B) to the light emitting element 1. Also, the adhesive member 93 is retained in the step difference 21b. Thus, the adhesive member 93 rises along the side surfaces of the resin member 21 can be prevented from easily reaching the light emitting element 1. The distance between the upper side surface and the lower side surface of the step difference 21b in a plan view (the difference in the positions of the side surfaces in a lateral direction in FIG. 8) is preferably about 1 µm to about 10 µm, and more preferably about 3 µm to about 6 µm. With this arrangement, the rising of the solder can be more effectively blocked.

Operation of Light Emitting Device

Next, with reference to FIG. 1A to FIG. 4 and FIG. 8, operation of the light emitting device 100 will be described. In the light emitting device 100, upon connecting the metal layers 31n and 31p, which are electrodes for external connection, to an external power supply via the mounting substrate 91, the current is supplied between the n-side electrode 13 and the p-side electrode 15 of the light emitting element 1. Then, upon being supplied with the current between the n-side electrode 13 and the p-side electrode 15, the active layer 12a of the light emitting element 1 emits light.

The light emitted by the active layer 12a of the light emitting element 1 propagates inside the semiconductor stacked-layer body 12, and is emitted from the lower surface (the upper surface in FIG. 8) or the side surfaces of the light emitting element 1, which is then extracted to the outside. The light that propagates in the upward direction (the downward direction in FIG. 8) inside the light emitting element 1 is reflected by the light-reflecting electrode 14a, and is emitted from the lower surface (the upper surface in FIG. 8) of the light emitting element 1, which is then extracted to the outside.

Method of Manufacturing Light Emitting Device

Figure 9:
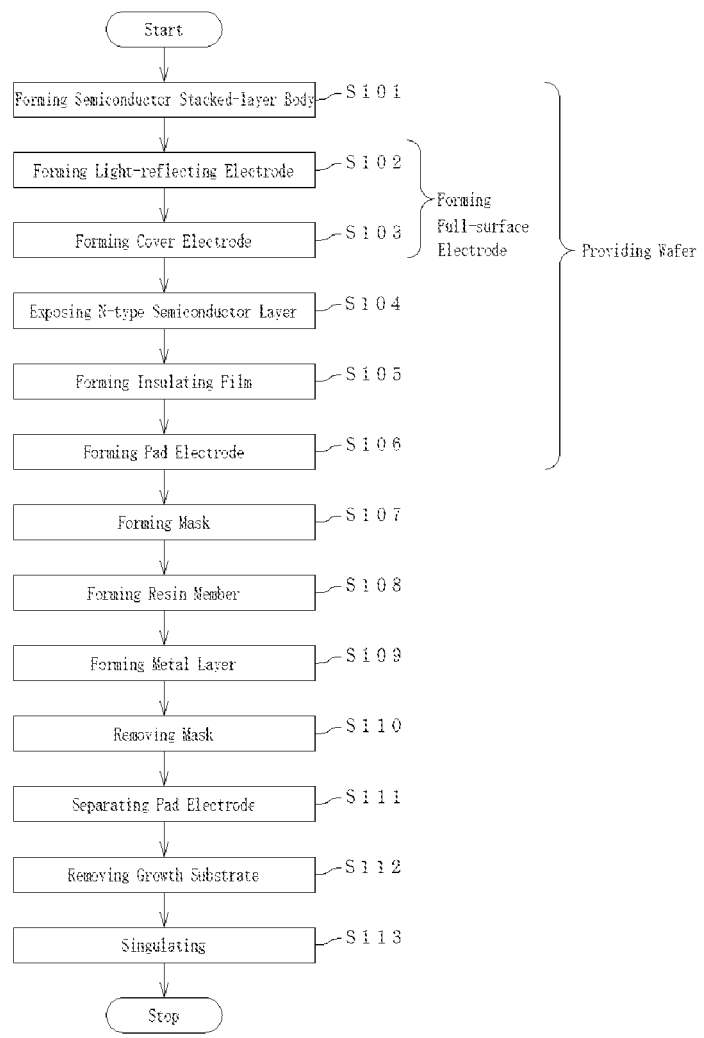
FIG. 9 is a flowchart showing a flow of a method of manufacturing a light emitting device according to an embodiment of the present invention.

Next, with reference to FIG. 9, a method of manufacturing the light emitting device 100 shown in FIG. 1A to FIG. 4 will be described. As shown in FIG. 9, the method of manufacturing the light emitting device 100 includes a step of forming a semiconductor stacked-layer body (S101), a step of forming a light-reflecting electrode (S102), a step of forming a cover electrode (S103), a step of exposing an n-type semiconductor layer (S104), a step of forming an insulating film (S105), a step of forming a pad electrode (S106), a step of forming a mask (S107), a step of forming a resin member (S108), a step of forming a metal layer (S109), a step of removing the mask (S110), a step of separating a pad electrode (S111), a step of removing a growth substrate (S112), and a step of singulating (S113), which are performed in this order. Further, the step of forming a semiconductor stacked-layer body (S101) to the step of forming the pad electrode (S106) are included in a step of providing a wafer, in which the light emitting elements 1 in a wafer state is provided, and the step of forming a light-reflecting electrode (S102) and the step of forming the cover electrode (S103) are included in a step of forming a full-surface electrode.

In the following, with reference to FIG. 10A to FIG. 16 (and to FIG. 1A to FIG. 7 and FIG. 9 as appropriate), each step will be described in detail. In FIG. 10A to FIG. 16, the shape, size, and positional relationship of the constituent elements may be simplified or exaggerated as appropriate. Further, in the steps of manufacturing the light emitting device 100 in wafer unit, the steps are performed in the state where a number of light emitting elements are aligned two-dimensionally. In FIG. 10A to FIG. 16, the cross-sectional views respectively show a single light emitting element and the plan views respectively show two light emitting elements directly adjacent to each other along the longitudinal side, among the arrays of a number of the light emitting elements. The cross-sectional views shown in FIG. 10A to FIG. 16 respectively correspond to the cross section taken along line I-I in FIG. 1B, similarly to the cross-sectional view of FIG. 4.

In the method of manufacturing the light emitting device according to an embodiment of the present invention, first, the step of providing a wafer is performed, in which a plurality of light emitting elements 1 are arrayed on a single growth substrate 11. As described above, the step of providing the wafer may include the step of forming the semiconductor stacked-layer body (S101), the step of forming the light-reflecting electrode (S102), the step of forming the cover electrode (S103), the step of exposing the n-type semiconductor layer (S104), the step of forming the insulating film (S105), and the step of forming the pad electrode (S106).

Figure 10A:
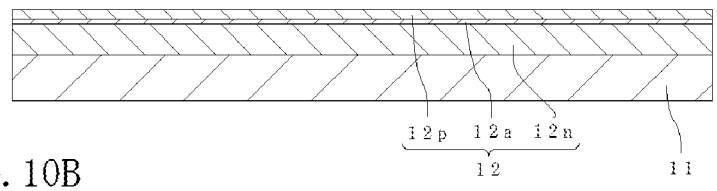

First, in the step of forming the semiconductor stacked-layer body (S101), as shown in FIG. 10A, on the upper surface of the growth substrate 11 made of sapphire or the like, a semiconductor stacked-layer body 12 is formed by successively stacking the n-type semiconductor layer 12n, the active layer 12a, and the p-type semiconductor layer 12p, respectively using the semiconductor materials described above.

Figure 10B:
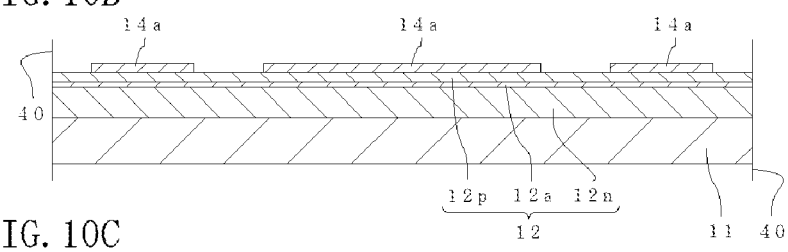

Next, in the step of forming the light-reflecting electrode (S102), as shown in FIG. 10B, the light-reflecting electrode 14a is formed at a predetermined region. The light-reflecting electrode 14a can be formed by using a lift-off method. That is, with the use of a photolithography, a resist pattern that defines openings corresponding to the regions for arranging the light-reflecting electrodes 14a is formed; then, a film of a metal material such as Ag which has good light reflectivity as described above, is disposed by using a sputtering method or a vapor deposition method on the entire upper surface of the wafer. With the removal of the resist pattern, the film of the metal material is patterned to form the light-reflecting electrode 14a.

Figure 10C:
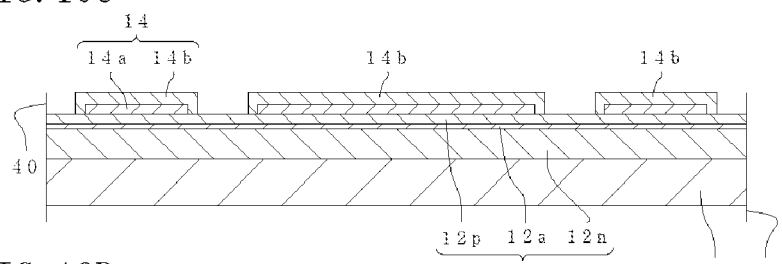

Next, in the step of forming the cover electrode (S103), as shown in FIG. 10C, the cover electrode 14b is formed so as to cover the upper and side surfaces of the light-reflecting electrode 14a. The cover electrode 14b is formed such that a film of a metal material is formed over the entire upper surface of the wafer by sputtering or deposition using a predetermined metal material, then, using a photolithography method, a resist pattern is formed to cover the area for arranging the cover electrode 14b. Then, etching is performed with the use of the resist pattern as a mask to pattern the film of the metal material. Then, the resist pattern is removed to obtain the cover electrode 14b.

Figure 10D:
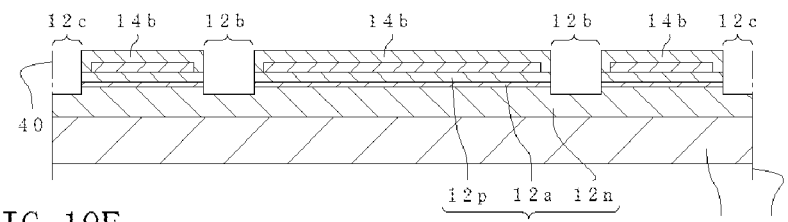

Next, in the step of exposing the n-type semiconductor layer (S104), as shown in FIG. 10D, in a portion of the semiconductor stacked-layer body 12, the p-type semiconductor layer 12p, the active layer 12a, and a portion of the n-type semiconductor layer 12n are removed by using a dry etching method. Thus, the step differences 12b and the step difference 12c where the n-type semiconductor layer 12n is exposed at the respective bottom surfaces are formed. In the example shown in FIG. 10D, the full-surface electrode 14 is used as an etching mask, so that the entire region having the p-type semiconductor layer 12p and the active layer 12a is coated by the full-surface electrode 14.

Figure 10E:
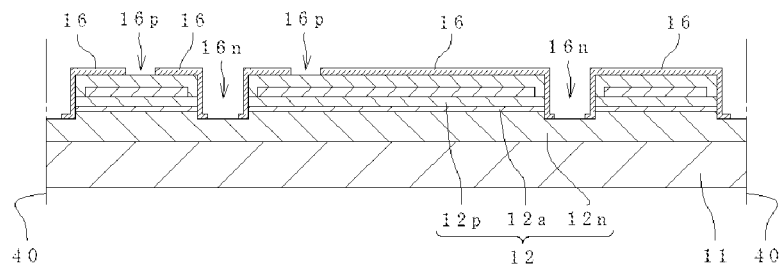

Next, in the step of forming the insulating film (S105), as shown in FIG. 10E, the insulating film 16 defining the openings 16n and the openings 16p at portions of the step differences 12b and portions of the upper surfaces of the cover electrode 14b is formed using a predetermined insulating material. Further, the insulating film 16 is formed to define openings also at portions of the bottom surfaces of the step differences 12c along the boundary lines, respectively 40. The bottom surface of each of the step differences 12c may be entirely coated by the insulating film 16 without creating any openings. Further, the insulating film 16 can be patterned such that, after a film of the insulating material is formed over the entire upper surface of the wafer by sputtering or the like, a resist pattern with openings at predetermined regions corresponding to the openings 16n and 16p and the like is formed, and etching is performed on the film of the insulating material.

Figure 11A:
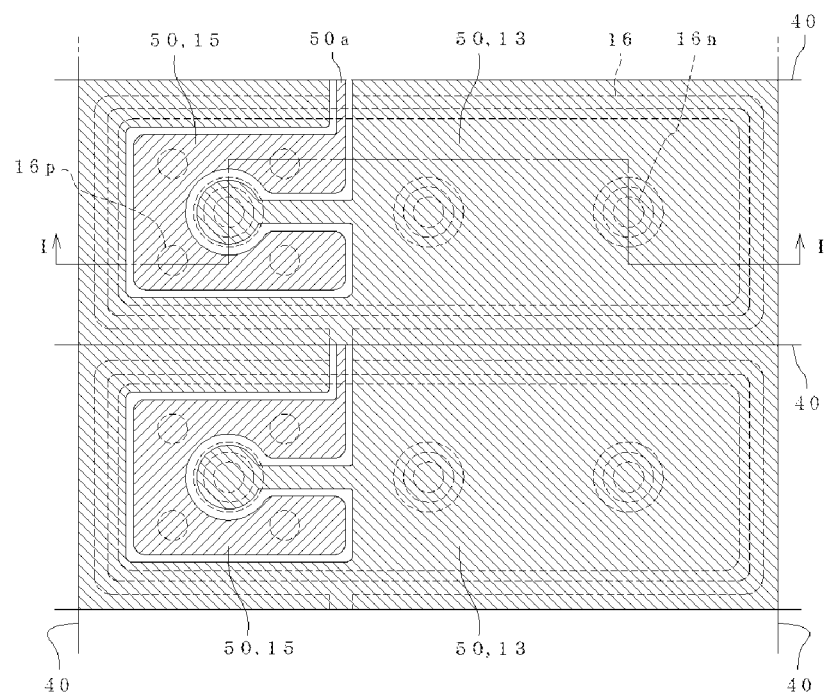
Figure 11B:
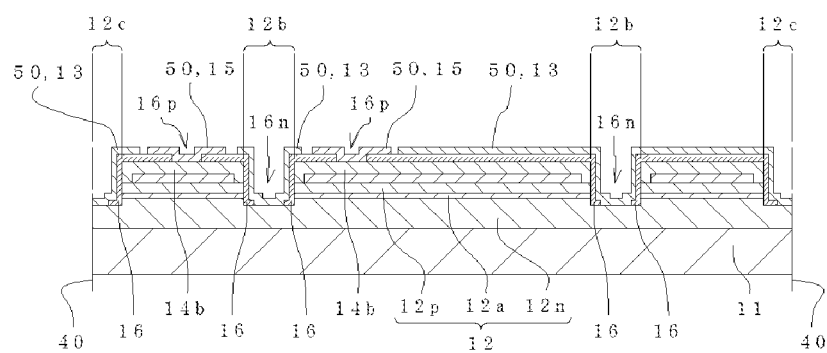

Next, in the step of forming the pad electrode (S106), as shown in FIGS. 11A and 11B, a metal layer 50 is formed on the insulating film 16 by using a sputtering method, for example. The metal layer 50 can be patterned by using a lift-off method, for example. The metal layer 50 is to be the n-side electrode 13 and the p-side electrodes 15 which are the pad electrodes of the light emitting element 1. Accordingly, the metal layer 50 is connected to the n-type semiconductor layer 12n in the openings 16n of the insulating film 16 disposed at the region for the n-side electrode 13 (regions shown by right down hatching in FIGS. 11A and 11B). Further, the metal layer 50 is connected to the cover electrode 14b in the openings 16p of the insulating film 16 disposed at the region for the p-side electrode 15 (regions shown by right up hatching in FIGS. 11A and 11B).

The metal layer 50 is formed with separate portions in the region of each of the light emitting elements 1 demarcated by the boundary lines 40 so that the region to be the n-side electrode 13 and the region to be the p-side electrode 15 do not contact with each other. However, the metal layer 50 is formed to be connected to all the light emitting elements 1 that are formed in the arrays on the wafer, such that an extending portion 50a of the metal layer 50 extended from the metal layer 50 to be the p-electrode 15 of a light emitting element 1 along the boundary line 40 (around the center at the top side in the longitudinal direction in FIG. 11A) is connected to the metal layer 50 to be the n-side electrode 13 of the adjacent light emitting element 1. The metal layer 50 is used as the seed layer serving as the current path at the time of forming the metal layers 31n and 31p by using an electroplating method in the step of forming a metal layer (S109). In the present embodiment, the metal layer 50 to be the n-side electrode 13 and the p-side electrode 15 to be the pad electrode is formed to also serve as the seed layer for electroplating, which allows for simplifying the manufacturing.

Figure 12A:
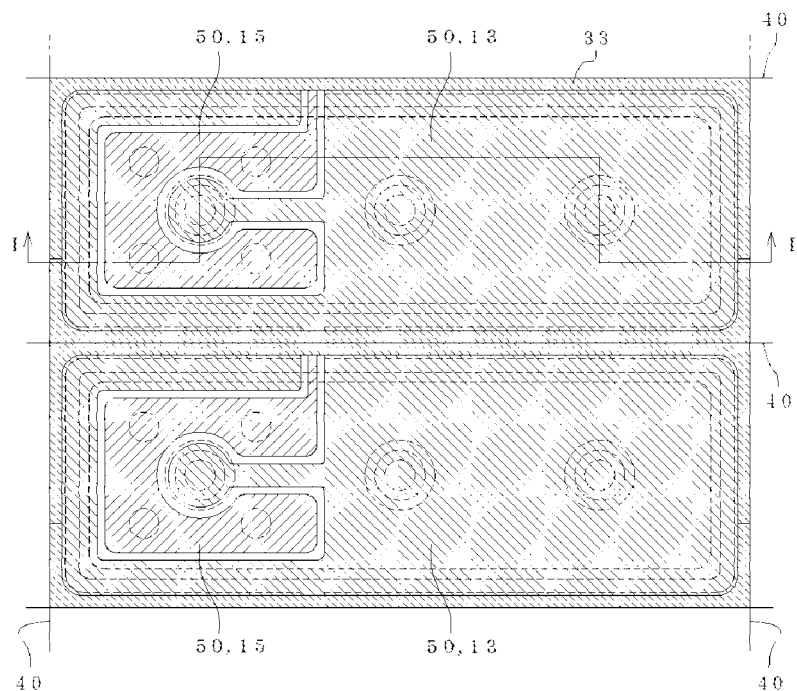
Figure 12B:
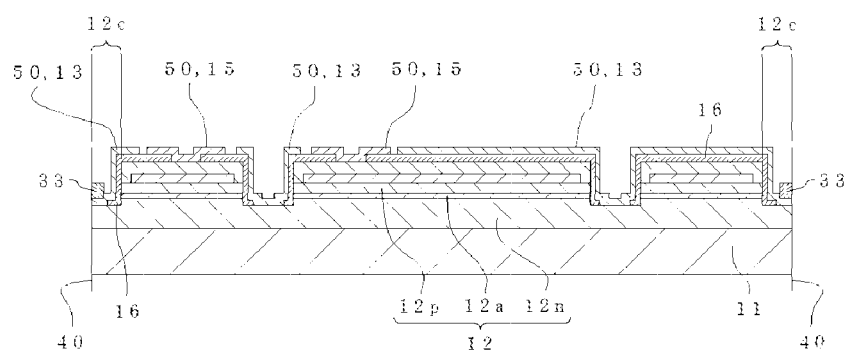

Next, in the step of forming the mask (S107), as shown in FIGS. 12A and 12B, a mask 33 that covers the metal layer 50 formed at the step differences 12c that are the regions along the boundary lines 40 is formed. The mask 33 may be formed using an insulating material such as a photoresist or $SiO_2$. The mask 33 is an insulating mask for preventing plating on the step differences 12c that are the boundary regions in the step of forming the metal layer (S109) that is to be performed. The mask 33 is made of a material different from that of the resin member 21, so as to be selectively removed in the step of removing the (S110) while leaving the resin member 21. Further, the mask 33 is preferably formed lower than the upper surface of the resin member 21 (see FIG. 13A) formed in the step of forming the resin member (S108) to be performed next, and wider than the openings 21a of the resin member 21 (see FIG. 13B). Thus, the step differences 21b (see FIG. 14B) can be formed at the side surfaces of the resin member 21.

Figure 13A:
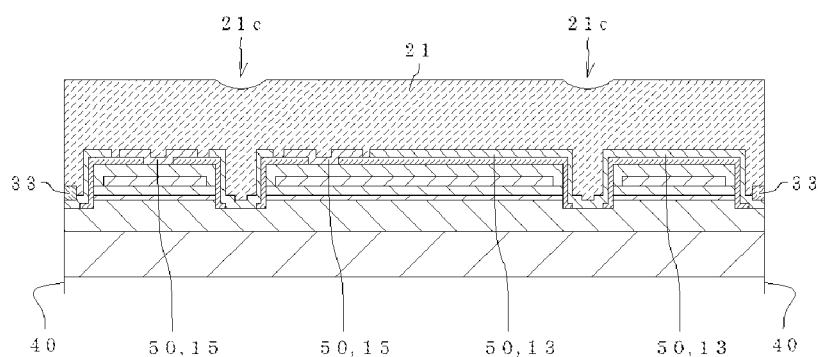
Figure 13B:
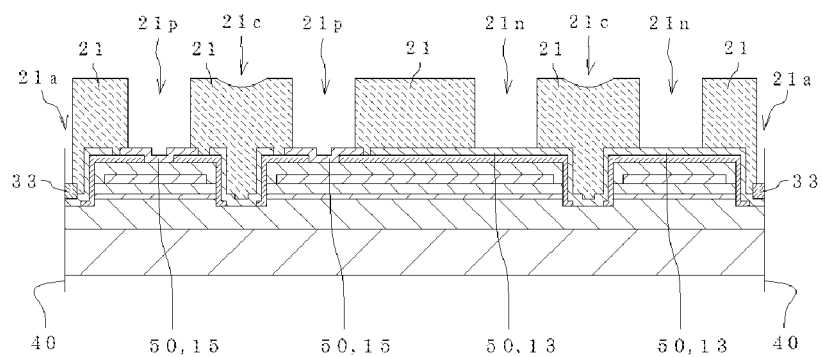

Next, in the step of forming the resin member (S108), as shown in FIG. 13B, the resin member 21 is formed on the metal layer 50 by using a photolithography method. The resin member 21 defines the openings 21n on the region to be the n-side electrode 13 of the metal layer 50 and the openings 21p on the region to be the p-side electrode 15 of the metal layer 50. Further, the resin member 21 defines the openings 21a on the regions along the boundary lines 40, so that the resin member 21 is formed for each region of the light emitting element 1, and separated for each of the light emitting elements 1. Further, the openings 21a are preferably defined to be narrower than the mask 33.

The step of forming the resin member 21 which uses a photolithography method may include sub-steps. First, as shown in FIG. 13A, a photoresist in a liquid form is evenly applied on the wafer by using a coating method such as spin coating or spraying (a step of coating). At this time, corresponding to the shape of the step differences 12b of the semiconductor stacked-layer body 12, concave depressions that become the recesses 21c are created at the upper surface of the coating film at the regions above the step differences 12b. By heating and drying (a step of curing) the coating film of the photoresist while maintaining the shapes of the concave depressions, the recesses 21c are defined in the upper surface of the resin member 21. Further, a step of exposing and developing is performed following the step of coating and the step of curing, thus, the openings 21n, 21p, and 21a are formed as shown in FIG. 13B.

In this step, in order to form the recesses 21c, the viscosity of the liquid photoresist is adjusted according to the shape (width, depth) of the step differences 12b, the thickness of the resin member 21, and the time required for heat-drying to cure the coating film. The recesses are also created in the upper surfaces of the coating film of the resin in the regions above the step differences 12c of the semiconductor stacked-layer body 12, respectively. In the step of forming the mask (S107), by forming the mask 33 at the step differences 12c with a height approximately same as the height of the upper surface of the metal layer 50 in the region where the cover electrode 14b is arranged—that is, by forming the mask 33 so as to substantially fill the step differences 12c—the upper surface of the resin coating film can be made approximately flat over the step differences 12c.

Figure 14A:
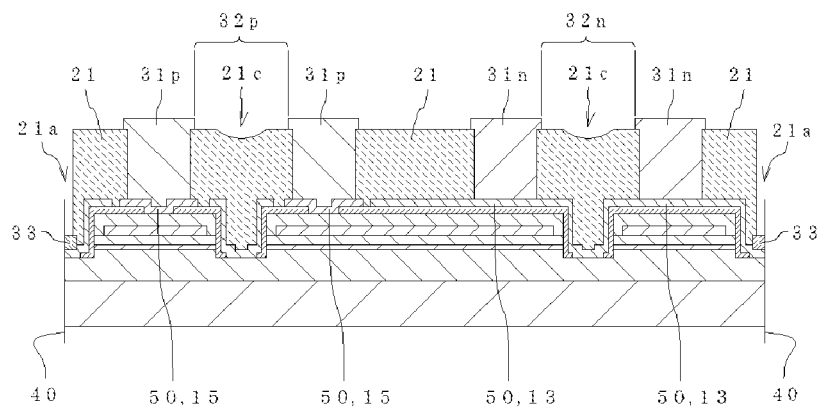

Next, in the step of forming the metal layer (S109), as shown in FIG. 14A, the metal layers 31n and 31p are formed in the openings 21n and 21p of the resin member 21 by using an electroplating method. As described above, the metal layers 31n and 31p are grown by plating in the openings 21n and 21p of the resin member 21 using the metal layer 50, which is formed to be conductive as a whole, as the seed layer which serve as the current path of electroplating. Further, in the step of forming the metal layer (S109), the resin members 21 respectively define the openings 21a in the step differences 12c (see FIG. 14B) which are the regions along the boundary lines 40, but the metal layer 50 is covered with the mask 33, so that the openings 21a are not subjected to the plating growth. Accordingly, a thick plating layer is not formed at the boundary regions, so that unnecessary portions of the metal layer 50 can be easily removed in the step of separating pad electrode (S111) which is to be executed in a later step.

In the example shown in FIG. 14A, the metal layers 31n and 31p are formed such that the upper portion of each of them are projected from the upper surface of the resin member 21, and such that the projecting upper portion extends to the outside of the openings 21n and 21p of the resin member 21 in a plan view. This is because at the time of plating growth, the metal layers 31n and 31p grow also in a lateral direction from the side surfaces of the upper portion which is projecting from the upper surface of the resin member 21.

Further, in the case where the area of the openings 21n and 21p is small, the upper surface of the upper portion of each of the metal layers 31n and 31p which are projecting from the resin member 21 may be rounded. In order to further planarize the upper surface of the metal layers 31n and 31p, the upper surface of the metal layers 31n and 31p may be planarized by grinding or polishing after electroplating.

Figure 14B:
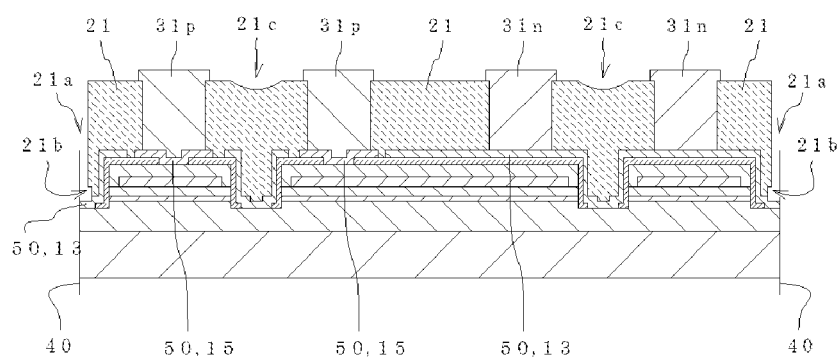

Next, in the step of removing the mask (S110), as shown in FIG. 14B, the mask 33 is removed with the use of any appropriate solvent or agent. Thus, the metal layer 50 formed in the regions along the boundary lines 40 is exposed at the bottom surface of the openings 21a of the resin member 21. Further, by removing the mask 33, the step difference 21b is formed at the lower side surfaces of the resin member 21.

Figure 15A:
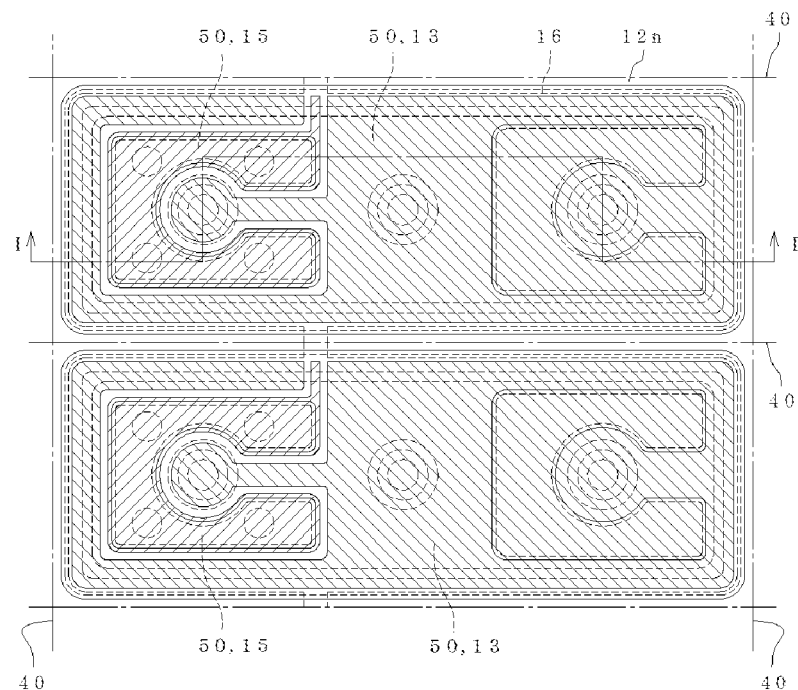
Figure 15B:
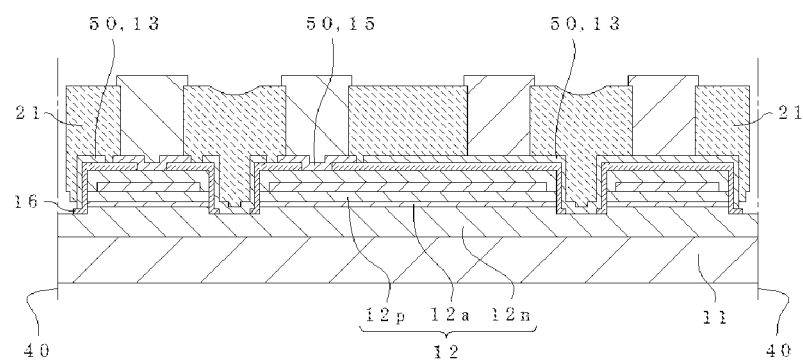

Next, in the step of separating the pad electrode (step of separating electrode) (S111), as shown in FIGS. 15A and 15B, the metal layer 50 exposed at the bottom surface of the openings 21a of the resin member 21 is removed by etching. Thus, the metal layer 50 is divided for each light emitting device 100. Also, in each light emitting device 100, the metal layer 50 is separated into the region to be the n-side electrode 13 and the region to be the p-side electrode 15.

At the time of etching the metal layer 50, a mask may be disposed on the upper surface of each of the metal layers 31n and 31p to prevent the metal layers 31n and 31p from being etched. Further, in the case where the metal layers 31n and 31p respectively have a thickness that is sufficiently greater than the thickness of the metal layer 50, the metal layer 50 may be etched without providing the mask on the upper surface of each of the metal layers 31n and 31p, permitting a reduction in the thickness of the metal layers 31n and 31p by approximately the thickness of the metal layer 50.

Figure 16:
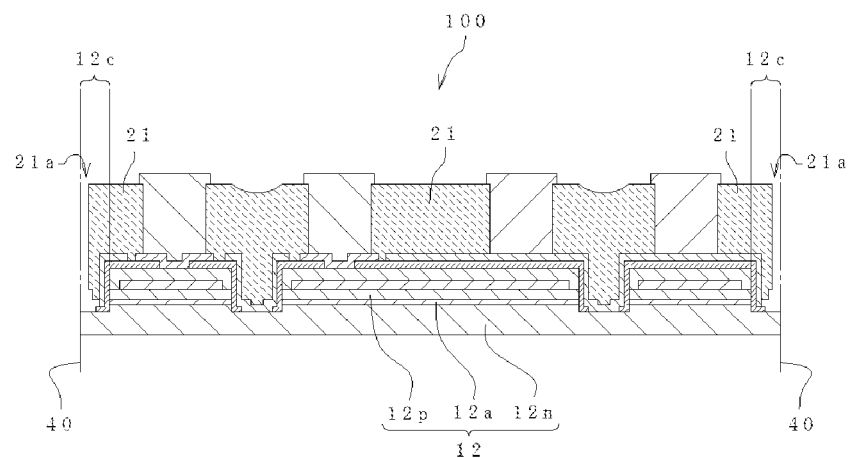
FIG. 16 is a schematic cross-sectional view illustrating removing a growth substrate in manufacturing of a light emitting device according to an embodiment of the present invention.

Next, in the step of removing the growth substrate (S112), as shown in FIG. 16, the growth substrate 11 is removed by peeling off by using a laser lift-off (LLO) method or a chemical lift-off method. The step of removing the growth substrate (S112) is not an essential step, and the growth substrate 11 may not be removed. Further, in place of peeling off the growth substrate 11, the lower surface side of the growth substrate 11 may be polished to reduce the thickness. Further, after the growth substrate 11 has been peeled off, the lower surface of the semiconductor stacked-layer body 12 may be wet-etched to form recesses-projections shape. Still further, after the growth substrate 11 has been peeled off, or without peeling the growth substrate 11 off, a phosphor layer that contains a phosphor for converting the wavelength of light emitted by the light emitting element 1 may be disposed on the lower surface side which serves as the light extraction surface of the light emitting device 100.

Next, in the step of singulating (S113), the light emitting device 100 is singulated by cutting the wafer along the boundary lines 40 shown in FIG. 16, with the use of a dicing method, a scribing method, or the like. The side surfaces that become the outer edges of the semiconductor stacked-layer body 12 that is formed by singulating is, as shown in FIG. 2A to FIG. 4, exposed without covered with the insulating film 16 and the resin member 21. The resin member 21 is formed with openings along the boundary lines 40, so that the resin member 21 is separated for each light emitting device 100, thus, singulating can be easily performed by simply cutting the semiconductor stacked-layer body 12.

Variation of Light Emitting Device

Figure 17A:
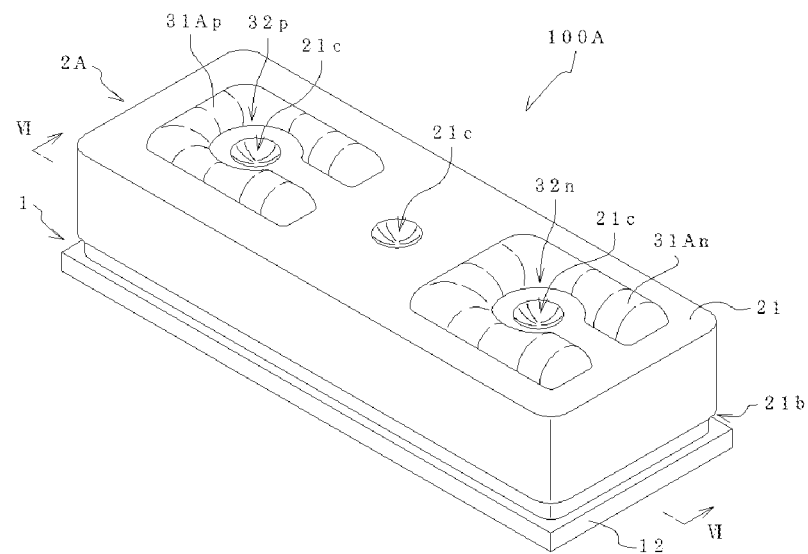
Figure 17B:
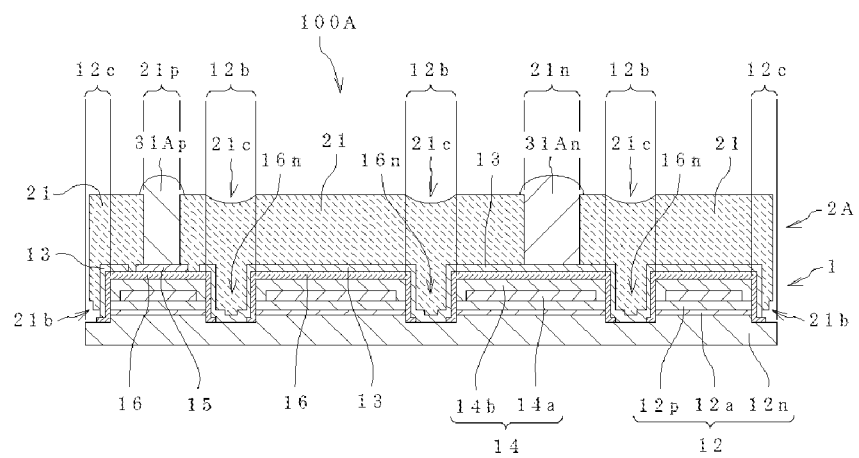

Next, with reference to FIGS. 17A and 17B, a light emitting device according to a variation of an embodiment of the present invention will be described. The plan view of the light emitting device 100A is similar to the plan view of the light emitting device 100 shown in FIG. 1B. As shown in FIGS. 17A and 17B, the light emitting device 100A according to the present variation is different in that it includes a support body 2A in place of the support body 2 of the light emitting device 100 shown in FIG. 1A and others. More specifically, in the metal layers 31n and 31p of the support body 2, the upper surfaces of the upper portions projecting from the resin member 21 are flat surfaces, while in the metal layers 31An and 31Ap of the support body 2A, the upper surfaces of the upper portions have an upwardly curving convex shape, that is, a dome shape. Other structures are similar to those of the light emitting device 100 and, therefore, identical reference numerals are allotted thereto and the description thereof will not be given.

The upper surface of each of the metal layers 31An and 31Ap has a dome-shape. Accordingly, at the time of mounting the light emitting device 100A by using a bonding member such as a solder, due to the dome-shape of the upper surfaces of the metal layers 31An and 31Ap, the bonding starts at the apex of the dome-shape and proceeds with the upper portion of each of the metal layers 31An and 31Ap digging into the bonding member. Thus, the light emitting device 100A is mounted. In this manner, in the light emitting device 100A, the flowability of the bonding member can be controlled to suppress the bonding defects due to occurrence of a void or the like. Accordingly, the bonding strength, the heat releasing property and the like of the light emitting device 100A can be improved.

Further, in the case where an anisotropic conductive material such as an anisotropic conductive paste (ACP) or an anisotropic conductive film (ACF) is used as the bonding member, the upper surface of each of the metal layers 31An and 31Ap is formed in a dome-shape so that the apex of the dome-shape becomes a contact point. Accordingly, secure bonding with a smaller load on the light emitting device 100A can be achieved. As a result, the load on the light emitting device 100A at the time of mounting can be reduced.

Further, the light emitting device 100A can be manufactured in a similar manner as the method of manufacturing the light emitting device 100 described above. That is, the metal layers 31An and 31Ap can be formed by electroplating in a similar manner as in the metal layers 31n and 31p in the step of forming the metal layer (S109) (see FIG. 9 and FIG. 14A). In electroplating, metal isotropically grows from the plating growth end. Accordingly, above the upper end surface of the openings 21n and 21p (see FIG. 13B) of the resin member 21, plating growth of the metal also proceeds in the lateral direction in addition to the upward direction. Accordingly, as shown in FIG. 17A, the upper portion of each of the metal layers 31An and 31Ap is formed in a dome-shape. Further, as shown in FIG. 17B, the upper portion of each of the metal layers 31An and 31Ap has a semicircular or rounded shape in a cross-sectional view taken along a plane perpendicular to the extension direction of the ridge line of an approximately C-shape in a plan view. In particular, the narrower the openings 21n and 21p with respect to the thickness of the upper portions projecting from the upper surface of the resin member 21, the more the center portions of the upper portions of the metal layers 31An and 31Ap project, resulting in an approximately a semicircular shape in a cross-sectional view. Other steps are similar to those in the method of manufacturing the light emitting device 100, the description thereof will be appropriately omitted.

The light emitting device of the present disclosure and the method of manufacturing the same have been specifically described based on an example of a mode for carrying out the invention, the aspects of the present invention are not limited to the description thereof, and should be broadly construed based on the scope of claims. Further, it goes without saying that various changes and modifications made based on the description are also included in the gist of the present invention.

What is claimed is:

1. A light emitting device comprising:
   a semiconductor light emitting element including a semiconductor stacked-layer body and an electrode disposed on a first surface of the semiconductor stacked-layer body;
   a resin member disposed on a first surface side of the semiconductor stacked-layer body; and
   a metal layer disposed in the resin member and electrically connected to the electrode;
   wherein a recess is defined in an upper surface of the resin member, and
   wherein the metal layer is projected from the upper surface of the resin member, and is disposed to surround at least a portion of the recess.

2. The light emitting device according to claim 1, wherein:
   the semiconductor stacked-layer body includes an n-type semiconductor layer and a p-type semiconductor layer stacked in this order, and a step difference having a bottom surface that is a surface of the n-type semiconductor layer, at a portion of a region inward of an outer edge of the semiconductor stacked-layer body in a plan view;
   the electrode covers a side surface of the step difference via an insulating film and is electrically connected to the bottom surface of the step difference; and
   the recess is defined in a region above the step difference.

3. The light emitting device according to claim 2, wherein an upper surface of the metal layer has an upwardly curving convex shape.

4. The light emitting device according to claim 2, wherein, in a plan view, the metal layer at least partially surrounds the recess.

5. The light emitting device according to claim 2, wherein the insulating film is made of at least two stacked layers comprising dielectrics that differ in index of refraction.

6. The light emitting device according to claim 1, wherein an upper surface of the metal layer has an upwardly curving convex shape.

7. The light emitting device according to claim 6, in a plan view, the metal layer at least partially surrounds the recess.

8. The light emitting device according to claim 1, wherein, in a plan view, the metal layer is at least partially surrounds the recess.

9. The light emitting device according to claim 1, wherein:
   the semiconductor stacked-layer body includes an n-type semiconductor layer and a p-type semiconductor layer in this order,
   the electrode includes an n-side electrode electrically connected to the n-type semiconductor layer, and a p-side electrode electrically connected to the p-type semiconductor layer,
   the metal layer includes an n-side metal layer electrically connected to the n-side electrode and a p-side metal layer electrically connected to the p-side electrode,
   wherein the recess is a first recess, and a second recess is further defined in the upper surface of the resin member, and
   in a plan view, the n-side metal layer and the p-side metal layer are each provided to respectively at least partially surround the corresponding first and second recesses.

10. The light emitting device according to claim 1, wherein the recess is defined in a bowl-shape.

11. The light emitting device according to claim 1, wherein, in a plan view, the recess is defined in a circular shape.

12. The light emitting device according to claim 1, wherein, in a plan view, the recess is defined with a diameter of 20 μm to 60 μm.

13. The light emitting device according to claim 12, wherein the recess is defined with a depth of 3 μm to 5 μm.

14. The light emitting device according to claim 13, wherein a difference in height between an upper surface of the metal layer and an upper surface of the resin member is 5 μm to 50 μm.

15. The light emitting device according to claim 1, wherein the recess is defined with a depth of 3 μm to 5 μm.

16. The light emitting device according to claim 1, wherein the resin member is made of a photosensitive resin material.

17. The light emitting device according to claim 1, wherein the resin member has a thickness of 30 μm to 50 μm.

18. The light emitting device according to claim 1, wherein a difference in height between an upper surface of the metal layer and an upper surface of the resin member is 5 μm to 50 μm.

19. A method of manufacturing a light emitting device including a semiconductor light emitting element having a semiconductor stacked-layer body and an electrode disposed at a first surface of the semiconductor stacked-layer body, the method comprising:
   providing a wafer having a plurality of light emitting elements arranged in an array, each light emitting element comprising a semiconductor stacked-layer body having an n-type semiconductor layer and a p-type semiconductor layer that are stacked, and a step difference formed by removing a portion of the semiconductor stacked-layer body from a predetermined region of an upper surface of the p-type semiconductor layer in a thickness direction to expose the n-type semiconductor layer;

forming a resin member, which comprises:
defining a recess by applying a liquid resin material to a first surface side of the semiconductor stacked-layer body to form a recess corresponding to a shape of the step difference in a surface of the applied resin material, and defining an opening in a portion of a surface region of the applied resin material above the electrode such that, in a plan view, the opening at least partially surrounds the recess;

forming a metal layer by filling the opening with a metal material so as to project further than an upper surface of the resin member; and singulating the wafer into a plurality of semiconductor light emitting devices by cutting the wafer along boundary lines between the semiconductor light emitting elements.

20. The method of manufacturing a light emitting device according to claim 19, wherein, in the step of forming the resin member, the opening is defined in the resin member by using a photolithography method.

* * * * *

UNITED STATES PATENT AND TRADEMARK OFFICE
CERTIFICATE OF CORRECTION

PATENT NO. : 9,559,006 B2  Page 1 of 1
APPLICATION NO. : 14/821369
DATED : January 31, 2017
INVENTOR(S) : Takayuki Sogo et al.

It is certified that error appears in the above-identified patent and that said Letters Patent is hereby corrected as shown below:

In the Claims

In Column 20, Lines 16 and 17, Claim 8, please replace "the metal layer is at least partially surrounds" with --the metal layer at least partially surrounds--.

Signed and Sealed this
Twelfth Day of September, 2017

Joseph Matal
*Performing the Functions and Duties of the
Under Secretary of Commerce for Intellectual Property and
Director of the United States Patent and Trademark Office*